(12) United States Patent
Nakamura (10) Patent No.: US 7,923,920 B2
(45) Date of Patent: Apr. 12, 2011

(54) ORGANIC LIGHT-EMITTING ELEMENTS OF LED WITH LIGHT REFLECTION LAYERS IN EACH SPACED ON OPPOSITE SIDES OF TRANSPARENT CONDUCTIVE LAYER

(75) Inventor: Naoto Nakamura, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 429 days.

(21) Appl. No.: 11/873,504

(22) Filed: Oct. 17, 2007

(65) Prior Publication Data

US 2008/0258609 A1     Oct. 23, 2008

(30) Foreign Application Priority Data

Oct. 24, 2006 (JP) .................................. 2006-288220
Sep. 28, 2007 (JP) .................................. 2007-253601

(51) Int. Cl.
  *H05B 33/00* (2006.01)
  *H01L 51/50* (2006.01)
  *H01J 1/63* (2006.01)
(52) U.S. Cl. ........... 313/504; 313/506; 313/507; 445/24
(58) Field of Classification Search ........... 313/500–512
    See application file for complete search history.

(56) References Cited

U.S. PATENT DOCUMENTS

| | | | | |
|---|---|---|---|---|
| 5,891,554 | A | 4/1999 | Hosokawa et al. | 428/212 |
| 6,124,024 | A | 9/2000 | Hosokawa et al. | 428/212 |
| 6,290,563 | B1 * | 9/2001 | Codama et al. | 445/24 |
| 6,541,130 | B2 | 4/2003 | Fukuda | 428/690 |
| 6,737,800 | B1 | 5/2004 | Winters et al. | 313/504 |
| 7,166,959 | B2 | 1/2007 | Suzuki et al. | 313/504 |
| 2005/0269947 | A1 * | 12/2005 | Kobayashi | 313/504 |
| 2006/0214573 | A1 * | 9/2006 | Maeda et al. | 313/506 |
| 2007/0102737 | A1 | 5/2007 | Kashiwabara et al. | 257/89 |
| 2007/0228367 | A1 | 10/2007 | Nakamura | 257/40 |

FOREIGN PATENT DOCUMENTS

| | | |
|---|---|---|
| JP | 04-328295 | 11/1992 |
| JP | 07-240277 | 9/1995 |
| JP | 2000-323277 | 11/2000 |
| JP | 2004-253389 | 9/2004 |
| JP | 2005-093399 | 4/2005 |
| JP | 2005-093401 | 4/2005 |
| JP | 2005-197011 | 7/2005 |

* cited by examiner

*Primary Examiner* — Nimeshkumar D Patel
*Assistant Examiner* — Tracie Green
(74) *Attorney, Agent, or Firm* — Fitzpatrick, Cella, Harper & Scinto (57) ABSTRACT

An organic light-emitting device has a substrate and a plurality of organic light-emitting elements formed on the substrate. The plurality of the organic light-emitting elements include a first light-emitting element emitting light of a first emission color, and a second light-emitting element emitting light of a different emission color. Each light-emitting element has, in sequence, a first electrode having a light reflection layer and a transparent conductive layer, an organic compound layer containing a light-emitting layer, and a second electrode on the substrate. The light reflection layer of the first element is between the substrate and the transparent conductive layer and the light reflection layer of the second element is between the transparent conductive layer and the organic compound layer. A thickness of the transparent conductive layer of the first and second organic light-emitting elements is the same.

11 Claims, 5 Drawing Sheets

EMITTED LIGHT

ORGANIC LIGHT-EMITTING ELEMENTS OF LED WITH LIGHT REFLECTION LAYERS IN EACH SPACED ON OPPOSITE SIDES OF TRANSPARENT CONDUCTIVE LAYER

BACKGROUND OF THE INVENTION

1. Field of the Invention

The present invention relates to an organic light-emitting device including an organic light-emitting element which emits light when an electric current is applied to an organic compound layer containing a light-emitting layer which is formed between a pair of electrodes, and a method for producing the same. Particularly, the present invention relates to an organic light-emitting device including an organic light-emitting element which can emit light of a plurality of colors, and a method for producing the same.

2. Description of the Related Art

Conventionally, an electroluminescence (EL) element and a light-emitting diode (LED) have been known as a self-luminous element for use in a display unit or a light source. Among them, an organic light-emitting element (hereinafter may be referred to as organic EL element or the element) including an organic compound material for a light-emitting layer has received attention, because the element can provide a luminance of hundreds to thousands $Cd/m^2$ or higher, even when being driven by a DC voltage of about 10 V or less.

Furthermore, the organic light-emitting element can emit three primary colors of light when being produced from such appropriately-selected organic compound materials as to emit spectra corresponding to red, green and blue, respectively. In addition, a full-color display unit can be relatively easily produced from a plurality of such organic light-emitting elements which are arranged on a substrate.

Figure 12:
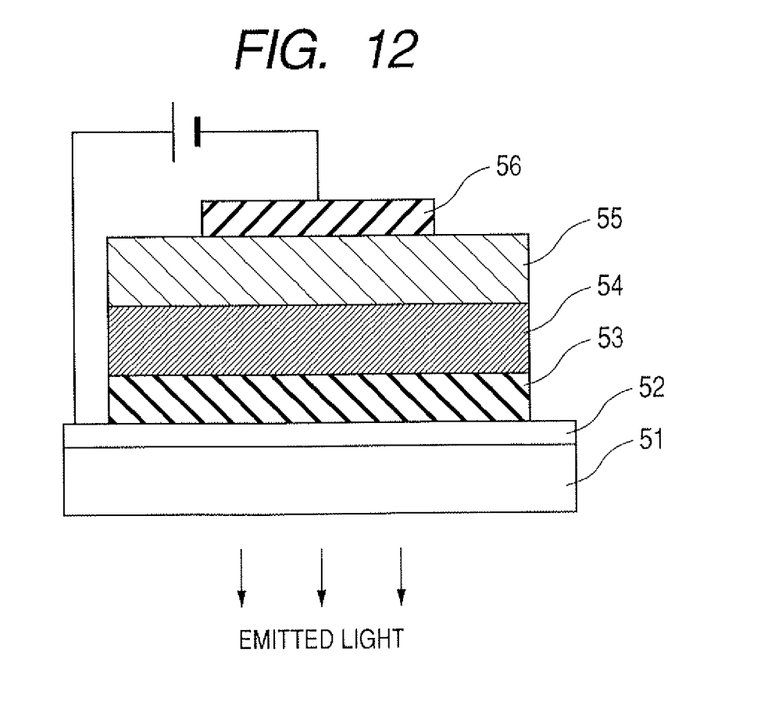
FIG. 12 is a schematically sectional view showing a diagrammatic structure of a conventional organic light-emitting element.

A structure of a conventional organic light-emitting element will be described with reference to FIG. 12. FIG. 12 is a schematic view showing a general structure of the conventional organic light-emitting element.

The conventional organic light-emitting element has a transparent anode layer 52 formed on a glass substrate 51; a hole transport layer 53 made of an organic material, an EL layer (light-emitting layer) 54 made of an organic material and an electron transport layer 55 sequentially stacked thereon in this order; and further a metal cathode layer 56 provided thereon, as is shown in FIG. 12. In addition, as needed, a hole injection layer is occasionally provided between the transparent anode layer 52 and the hole transport layer 53, and an electron injection layer is further occasionally provided between the metal cathode layer 56 and the electron transport layer 55.

In the organic light-emitting element shown in FIG. 12, the transparent anode layer 52 formed on the glass substrate 51 transmits light. The metal cathode layer 56 is made of aluminum, magnesium, indium, silver or an alloy thereof, and reflects light. A light emitted from the EL layer 54 passes through the transparent anode layer 52 and is emitted to the side of the glass substrate 51. An element structure of emitting light from the substrate side as described above is referred to as a bottom emission type (hereinafter described as a BE type). On the other hand, an organic EL element having a structure of emitting light to the opposite side of the substrate is referred to as a top emission type (hereinafter described as a TE type). In the top-emission-type organic light-emitting element, in general, an electrode formed on the glass substrate has light reflectivity, and an electrode formed on the opposite side of the above electrode across an organic layer has light-transmissive property.

It has been known that an organic light-emitting element having such a structure as shown in FIG. 12 has dependency of the luminance on a film thickness, which means that the luminance varies according to the film thickness of an electron transport layer 55, because an interference effect formed by a light emitted directly to a glass substrate 51 side and a light reflected on a metal cathode layer 56 also varies according to the thickness of the electron transport layer 55. Thus, a technology of prescribing the thickness of the electron transport layer 55 in a BE-type element is disclosed for the purpose of optimally adjusting an optical path difference between an EL layer 54 and a metal cathode layer 56 that is a reflection layer (see Japanese Patent Application Laid-Open No. H04-328295).

A technology is also disclosed which enhances the color purity of a BE-type organic light-emitting element having the same structure as in the case of Japanese Patent Application Laid-Open No. H04-328295, by optimizing not only the thickness of an electron transport layer but also a total thickness of an optical film of a high-refractive transparent electrode such as ITO and an organic multilayered portion (see Japanese Patent Application Laid-Open No. H07-240277). Specifically, the technology sets the total thickness of the optical film of the transparent electrode and the organic multilayered portion so that the total thickness can enhance the strength of the emitted light in a center wavelength $\lambda$, which is generated from the organic multilayered portion having a refractive index of 1.6 to 1.8. The above described $\lambda$ is selected from the wavelengths of 440 to 490 nm, 500 to 550 nm and 600 to 650 nm. The technology described in the Japanese Patent Application Laid-Open No. H07-240277 optimizes the optical film thickness with respect to a predetermined emission wavelength, by varying the thickness of the high-refractive transparent electrode (such as ITO).

On the other hand, a technology is disclosed which is used in a multicolor organic electroluminescence display unit having a light-emitting layers for emitting lights of a plurality of colors (Japanese Patent Application Laid-Open No. 2000-323277). The multicolor organic EL display unit has many organic EL elements having respective light-emitting layers for emitting lights of red, green and blue colors having different emission spectra arranged on a substrate, and therefore the process of varying a thickness of a transparent electrode (such as ITO) for every different color becomes complicated. Then, the technology described in Japanese Patent Application Laid-Open No. 2000-323277 gives each different film thickness corresponding to each emission color to any of functional layers having the same function (for instance, a hole transport layer or an electron transport layer) in an organic compound material layer except the light-emitting layer, in the multicolor organic electroluminescence display unit. Accordingly, the transparent electrode can be set at a fixed film thickness throughout the all organic EL elements, and has no need of being adjusted into a different thickness corresponding to each color by etching. Incidentally, the technologies described in the Japanese Patent Application Laid-Open Nos. H04-328295, H07-240277 and 2000-323277 provide examples of a BE type.

Furthermore, a technology is disclosed which can be applied to a TE type in which a lower electrode formed on a substrate is a reflective electrode and an upper electrode arranged thereon through an organic layer is a transparent electrode (see Japanese Patent Application Laid-Open No. 2004-253389). The technology described in Japanese Patent Application Laid-Open No. 2004-253389 optimizes an optical path length between a light-emitting layer (light-emitting plane if precisely being described) and a reflective lower electrode, so as to be appropriate to each light of red, green and blue.

Specifically, the technology described in the Japanese Patent Application Laid-Open No. 2004-253389 provides a multicolor organic EL display unit having a structure in which light emitted from a white light-emitting layer is separated into each light of red, green and blue, by using a filter. The thicknesses of the transparent electrode and a transparent optical layer are varied so that a distance between the white light-emitting layer and the lower reflective electrode can be optically optimized in accordance with a light of each color.

Japanese Patent Application Laid-Open Nos. 2005-197011, 2005-093399 and 2005-93401 describes a technology relating to an element structure in which an upper electrode is semi-transparent and forms a micro-resonator structure between the upper electrode and a lower reflective electrode. These technologies optically optimize a distance between a light-emitting layer and the lower reflective electrode and a distance between the upper and lower electrodes, by adjusting a thickness of ITO which is a transparent electrode according to an emission color, by stacking and etching the ITO.

As is described in Japanese Patent Application Laid-Open No. H04-328295, emission intensity is distributed in a light-emitting layer so as to be highest on an interface of the light-emitting layer in a hole injection side. Accordingly, all of the above described conventional technologies consider the interface of the light-emitting layer in the hole injection side (normally, the interface between the light-emitting layer and the hole transport layer) as a light-emitting plane, when designing an optical structure.

In addition, an optical path length is defined as the product (nd) of a refractive index (n) of a medium in which light travels and a distance (d) in which the light travels. By the way, an emitted light passes through a film such as an organic layer and a transparent electrode in an organic EL element, so that a term "optical film thickness" is used as well, but such terms as "optical path difference", "optical film thickness", "optical length" and "optical path length" are all used in the same meaning.

However, the above described conventional technologies had various problems to be solved.

Technologies described in Japanese Patent Application Laid-Open Nos. H04-328295 and H07-240277 do not sufficiently disclose how the technologies can be applied to each organic light-emitting element, when an organic light-emitting device has many organic light-emitting elements which emit lights of emission colors such as red, green and blue, formed on the same substrate.

A technology described in Japanese Patent Application Laid-Open No. 2000-323277 optimizes an optical length by adjusting a thickness of an organic compound layer except for a light-emitting layer, in order to apply the technology described in Japanese Patent Application Laid-Open No. H07-240277 to an organic light-emitting device having many organic light-emitting elements which emit lights with a plurality of emission colors, because it is difficult to change a thickness of a transparent electrode (ITO) according to each emission color. However, each organic compound layer, such as an electron transport layer and a hole transport layer, for forming the organic light-emitting element has the optimal thickness which is determined by electric properties such as the injectability and transportability of electrons and holes, and electric resistance. Accordingly, various problems appear when the thickness of each organic compound layer for forming the organic light-emitting element is determined for the purpose of optimizing the optical path length. Specifically, when the film thickness determined for optimizing the optical path length is different from the film thickness determined on the basis of electric characteristics, the organic light-emitting device has to sacrifice the electric characteristics, though being preferable when the former thickness matches the latter thickness by chance. When the film thicknesses are set as is described above, the organic light-emitting element of emitting a light of a particular color occasionally results in needing high driving voltage.

A technology described in Japanese Patent Application Laid-Open No. 2004-253389 describes that a transparent electrode and a transparent optical layer can be patterned by a standard photographic method and the film thickness can be changed by stacking the layer. But, it does not disclose anywhere specifically how to stack the layer.

In addition, Japanese Patent Application Laid-Open Nos. 2005-197011, 2005-093399 and 2005-093401 disclose a technology of changing the thickness of a transparent electrode (ITO and IZO) according to each emission color, which has been considered to be difficult in the technology described by Japanese Patent Application Laid-Open No. 2000-323277. However, the technology of changing the thickness of the transparent electrode according to the emission color needs a complicated step like the step of etching an IZO layer using a crystallized ITO as an etching stop, or the step of forming a resist on a position corresponding to each emission color and etching ITO. Particularly, the ITO has transparency, so that it is difficult to confirm an end point of etching by visual inspection. An optical path length is a product obtained by multiplying the thickness of the transparent electrode (ITO) in which light transmits by the refractive index, so that the transparent electrode needs to be formed in a precise film thickness in order to optically design the optical path length, but the conventional technologies had difficulty in forming the transparent electrode in the precise thickness.

In addition, technologies described in Japanese Patent Application Laid-Open Nos. 2000-323277, 2004-253389, 2005-197011, 2005-093399 and 2005-093401 change the thicknesses of a transparent electrode, a transparent optical layer and a hole transport layer formed on a substrate so as to correspond to a light of each emission color. Accordingly, in a process step of forming an upper electrode, a height from the substrate up to the top surface of an organic compound layer is different depending on a position corresponding to each emission color.

In addition, technologies described in Japanese Patent Application Laid-Open Nos. 2004-253389, 2005-197011, 2005-093399 and 2005-093401 disclose a TE-type organic EL element. The TE-type organic EL element has a light-transmissive electrode (a metal thin film, or a transparent electrode made of ITO, normally by using a sputtering method) formed on the whole top surface of an organic layer as an upper electrode. Particularly, the technologies described in Japanese Patent Application Laid-Open Nos. 2005-197011, 2005-93399 and 2005-93401 form an upper electrode made of a metal thin film so as to make the electrode a semi-light-transmissive electrode having partially reflectivity and partially transparency, in order to form a micro-resonator structure. In addition, the technology described in Japanese Patent Application Laid-Open No. 2005-197011 further forms a transparent conductive layer made of ITO on the upper electrode, so as to lower a resistance value. These upper electrodes having a light-transmissive property need to have a high light-transmissive property for efficiently emitting light to the outside and have a sufficient electroconductive property.

However, technologies described in Japanese Patent Application Laid-Open Nos. 2004-253389 and 2005-093401 result in forming a step (difference of film thickness) between positions corresponding to respective emission colors, because in formation of an organic layer including a light-transmissive electrode layer which is an upper electrode, a height from a substrate up to the top surface of the organic layer is different in the positions corresponding to respective emission colors. Accordingly, in consideration that the upper electrode should not cause discontinuities in a part at which the step is formed (coverage property), the upper electrode needed to be formed thick (for instance, about 100 nm or thicker), when formed of a transparent electrode such as ITO. When the upper electrode is a metal thin film, the thickness is limited to 10 nm or smaller in consideration of the light-transmissive property, and it is difficult to decrease the electric resistance, so that the resistance is decreased by electrically conducting the metal thin film to a auxiliary electrode formed on a substrate, in Japanese Patent Application Laid-Open Nos. 2005-093399 and 2005-093401. In this case as well, when there is the step, the metal thin film is easily cut (tends to cause discontinuities at the step), which is unpreferable. Furthermore, when a sealing film is formed on the transparent electrode layer or the organic layer as the technology described in Japanese Patent Application Laid-Open No. 2004-253389, if the surface on which the sealing film is to be formed has unevenness, the sealing film needs to be formed thick so as to secure its moisture barrier characteristics. However, the thick sealing film has not been desirable, because of lowering the light-transmissive property and needing a longer period of time in a production process.

Further features of the present invention will become apparent from the following description of exemplary embodiments with reference to the attached drawings.

SUMMARY OF THE INVENTION

The present invention is designed with respect to the above described circumstances, and provides an organic light-emitting device which can enhance the light extraction efficiency of organic light-emitting elements for emitting lights of respective emission colors, while reducing a step difference between the organic light-emitting elements for emitting lights of the respective emission colors. The present invention also is directed to a process of producing such an organic light-emitting device in a simpler process.

An organic light-emitting device according to the present invention includes a substrate, and a plurality of organic light-emitting elements formed on the substrate, wherein the plurality of the organic light-emitting elements include a first organic light-emitting element which emits a light of a first emission color, and a second organic light-emitting element which emits a light of a second emission color different from the first emission color, wherein each of the organic light-emitting elements has a first electrode having a light reflection layer and a transparent conductive layer, an organic compound layer containing a light-emitting layer, and a second electrode which is a light extraction electrode, in this order on the substrate, wherein the light reflection layer of the first organic light-emitting element is formed between the substrate and the transparent conductive layer, wherein the light reflection layer of the second organic light-emitting element is formed between the transparent conductive layer and the organic compound layer, wherein a thickness of the transparent conductive layer of the first organic light-emitting element is the same as a thickness of the transparent conductive layer of the second organic light-emitting element.

A method for producing an organic light-emitting device according to the present invention is a method for producing an organic light-emitting device including a plurality of organic light-emitting elements including a first organic light-emitting element which emits a light of a first emission color and a second organic light-emitting element which emits a light of a second emission color different from the first emission color, including the steps of: forming a first electrode having a light reflection layer and a transparent conductive layer on a substrate; forming an organic compound layer including a light-emitting layer on the first electrode; and forming the second electrode as a light extraction electrode on the organic compound layer, wherein the step of forming the first electrode includes, in mentioned order: a step of forming the light reflection layer on a region of the first organic light-emitting element, a step of forming the transparent conductive layer on and between both regions of the first and second organic light-emitting elements, a step of forming the light reflection layer on the region of the second organic light-emitting element, and a step of removing the transparent conductive layer formed between the elements.

A method for producing an organic light-emitting device according to the present invention is a method for producing an organic light-emitting device having a plurality of organic light-emitting elements including a first organic light-emitting element which emits a light of a first emission color, a second organic light-emitting element which emits a light of a second emission color different from the first emission color, and a third organic light-emitting element which emits a light of a third emission color different from lights of the first and second emission colors, including the steps of: forming the first electrode having a light reflection layer and a transparent conductive layer on a substrate, forming an organic compound layer including a light-emitting layer on the first electrode; and forming a second electrode as a light extraction electrode on the organic compound layer, wherein the step of forming the first electrode includes, in mentioned order: a step of forming the light reflection layer on a region of the first organic light-emitting element, a step of forming a first transparent conductive layer on and between regions of the first to third organic light-emitting elements, a step of forming the light reflection layer on the region of the second organic light-emitting element, a step of forming a second transparent conductive layer on and between regions of the first to third organic light-emitting elements, a step of forming the light reflection layer on the region of a third organic light-emitting element and a step of removing the first and second transparent conductive layers formed between the elements.

In an organic light-emitting device according to the present invention, the first electrode has a reflection layer and a transparent conductive layer, and changes a stacking order of the reflection layer and the transparent conductive layer corresponding to respective emission colors. By changing the stacking order in the above way, the organic light-emitting device can appropriately use an organic light-emitting element which uses the transparent conductive layer as a layer for adjusting an optical path length for enhancing light extraction efficiency, and an organic light-emitting element which does not use the transparent conductive layer as the layer for adjusting the optical path length.

In this case, the transparent conductive layer can be formed commonly on a plurality of the organic light-emitting elements for emitting lights of different emission colors. This is because the transparent conductive layer of the element which does not use the transparent conductive layer in order to adjust an optical path length can be formed so as to have the same thickness as the transparent conductive layer of the element which uses the transparent conductive layer for adjusting the optical path length, because of being formed between a substrate and the above described reflection layer, and having no need to strictly control the thickness.

Accordingly, even in the case of forming the first electrode including an inorganic oxide material such as ITO, the first electrode can be optically optimally designed on a reflective electrode side (on the first electrode side containing the reflection layer) according to the emission color, without requiring a complicated process of patterning and adjusting the thickness of the first electrode by using an etching technique or the like.

The drive voltage of an organic light-emitting element also does not increase, because of not needing to positively change a thickness of a layer which does not originally need to change the thickness according to each emission color (for instance, a charge injection layer, a charge transport layer and the like), for the purpose of adjusting the optical path length on the first electrode side including the reflection layer, when viewed from a light-emitting layer.

Furthermore, the organic light-emitting device can equalize the total thickness of the first electrode with respect to light-emitting elements for emitting lights of a plurality of emission colors. Accordingly, the organic light-emitting device can reduce a step difference on the surface of an organic layer when forming the second electrode or a sealing layer, and can consequently reduce the risk of causing discontinuities at the step.

Thus, the organic light-emitting device according to the present invention can enhance the light extraction efficiency of a light-emitting element for emitting a light of each emission color while inhibiting a layer formed on the organic compound layer from discontinuities at the step difference, without using a complicated production process.

Further, the features of the present invention will become apparent from the following description of exemplary embodiments with reference to the attached drawings.

DESCRIPTION OF THE EMBODIMENTS

An organic light-emitting device according to the present invention has a substrate and a plurality of organic light-emitting elements formed on the substrate, wherein the plurality of the organic light-emitting elements include the first organic light-emitting element which emits a light of the first emission color and the second organic light-emitting element which emits a light of the second emission color different from the first emission color. Each organic light-emitting element has the first electrode having a light reflection layer and a transparent conductive layer; an organic compound layer containing a light-emitting layer; and the second electrode which is a light extraction electrode, in this order on the above described substrate. The reflection layer is a layer having a high reflectance of about 60% to 100%, so that a metal layer can be used for it. The transparent conductive layer is a layer which transmits light and is electroconductive, and a metal oxide such as ITO, IZO and ITZO can be used for it. In the present invention, an electrode means not only a layer directly contacting an organic compound, but also the whole of a plurality of stacked conductive layers. In addition, the light extraction electrode is an electrode through which an emitted light is taken out to the outside. In the present invention, the second electrode is the light extraction electrode. The light extraction electrode may be a transparent conductive layer containing the metal oxides such as ITO, IZO and ITZO; may be such a thin film of a metal as to transmit light therethrough; or may be a stacked multilayer thereof.

In an organic light-emitting device according to the present invention, a reflection layer of the first organic light-emitting element is formed between a substrate and a transparent conductive layer, and a reflection layer of the second organic light-emitting element is formed between the transparent conductive layer and an organic compound layer. By forming the reflection layer in the above way, the organic light-emitting device uses the transparent conductive layer as a layer for setting an optical path length for enhancing light extraction efficiency in the first organic light-emitting element, and does not use the transparent conductive layer as the layer for setting the optical path length, in the second organic light-emitting element. The first organic light-emitting element and the second organic light-emitting element emit lights of different colors, respectively, and have different optical path lengths for enhancing the light extraction efficiency. Then, the organic light-emitting device can give respective different optical path lengths to organic light-emitting elements by using the transparent conductive layer as the layer for setting the optical path length and by not using the transparent conductive layer.

There are two cases of adjusting the optical path length. One is the case of adjusting the optical path length between a position of emitting light in a light-emitting layer and a reflecting position of the reflection layer, and the other is the case of adjusting the optical path length between the reflecting position of the reflection layer and a reflection interface formed on a light-extracting side closer than the second electrode, which is the case of forming a resonator structure. The reflection interface in the latter case is any of an interface of a light-emitting side of the second electrode, an interface of a light-extracting side of the second electrode, and an interface of either upper or lower side of a layer stacked on the second electrode. Among these interfaces, an interface can be used as the reflection layer (an interface having a reflectance of about 10% or higher), which has such a high reflectance as to be able to increase the light extraction efficiency by using a resonance phenomenon.

As described above, an organic light-emitting device according to the present invention can reduce a difference of the whole thickness among light-emitting elements which emit lights of respective different colors, because though the organic light-emitting device sets an optical path length in each element so as to enhance light extraction efficiency, the first electrode has both of a reflection layer and a transparent conductive layer, regardless of the emission color. Besides, the transparent conductive layer of each element has the same thickness regardless of the emission color. Accordingly, the organic light-emitting device can inhibit a layer which is formed on an organic compound layer such as the second electrode or a sealing layer and is commonly formed on and between a plurality of elements, from causing discontinuities at the step to a step difference produced by a difference between the thicknesses. The above described discontinuities at the step means that a layer is completely divided, or that a layer is so thinned as to impair an original function of the layer even though not completely divided.

As described above, an organic light-emitting device according to the present invention emits the lights of two colors which are the first emission color and the second emission color. But the emission colors are only to be plural. Accordingly, the organic light-emitting device can be applied to an organic light-emitting device which emits lights of three or more different emission colors. For instance, when the organic light-emitting device according to the present invention is applied to an organic light-emitting device which emits lights of three emission colors, specifically, which has the third organic light-emitting element that emits the light of the third emission color in addition to the lights of the first and second emission colors, the organic light-emitting device can solve the problems of the present invention by making the first electrode further having the second transparent conductive layer. In other words, the organic light-emitting device can form each of the organic light-emitting elements of the three emission colors so as to have each different optical path length for enhancing light extraction efficiency. In this case, the device employs a structure in which the second transparent conductive layer is formed on a light-extracting side of the above described transparent conductive layer (first transparent conductive layer). In the structure, a reflection layer of the first organic light-emitting element is formed between a substrate and the transparent conductive layer, a reflection layer of the second organic light-emitting element is formed between the transparent conductive layer and the second transparent conductive layer, and a reflection layer of the third organic light-emitting element is formed between the second transparent conductive layer and an organic compound layer, respectively.

A method for producing an organic light-emitting device according to the present invention includes the following steps: specifically, a step of forming the first electrode having a reflection layer and a transparent conductive layer on a substrate; a step of forming an organic compound layer containing a light-emitting layer on the first electrode; and a step of forming the second electrode which is a light extraction electrode on the organic compound layer. The above step of forming the first electrode includes the sequential steps of: forming the reflection layer on the region of the first organic light-emitting element; forming the transparent conductive layer on and between the regions of the first and second organic light-emitting elements; and removing the transparent conductive layer formed between the elements. The organic light-emitting device according to the present invention can form the transparent conductive layer commonly on and between a plurality of the elements regardless of an emission color, and accordingly can be produced in a simpler process. The organic light-emitting device also can use the transparent conductive layer formed into a predetermined thickness for adjusting an optical path length, without needing to adjust the thickness of the formed transparent conductive layer by using an etching technique.

An organic light-emitting device of emitting lights of three different emission colors also can be produced by the same steps except for the step of forming the first electrode. The step of forming the first electrode includes the sequential steps of: forming a reflection layer on the region of the first organic light-emitting element; forming the first transparent conductive layer on and between all regions of the first to third organic light-emitting elements; forming the reflection layer on the region of the second organic light-emitting element; forming the second transparent conductive layer on and between all the regions of the first to third organic light-emitting elements; forming the reflection layer on the region of the third organic light-emitting element; and removing the first and second transparent conductive layers formed between the elements. The organic light-emitting device of emitting lights of three different emission colors according to the present invention also can form the transparent conductive layer commonly on and between a plurality of the elements regardless of an emission color, and accordingly can be produced in a simpler process. The organic light-emitting device also can use the transparent conductive layer formed into a predetermined thickness for adjusting an optical path length, without needing to adjust the thickness of the formed transparent conductive layer by using an etching technique.

In the next place, embodiments of an organic light-emitting device according to the present invention will be described in more detail with reference to the drawings.

First Embodiment

FIG. 1 to FIG. 9 are schematically sectional views showing the sequential steps of a process of producing an organic light-emitting device according to a first embodiment of the present invention.

The organic light-emitting device according to the first embodiment of the present invention has organic light-emitting elements which can emit the lights of three colors (three primary colors) of red, green and blue respectively formed on a substrate. However, such an organic light-emitting device can be also produced in a similar production process to that of the above organic light-emitting device, as is further provided with an organic light-emitting element which can further emit another color like a white color, in addition to the three primary colors of red, green and blue. Each organic light-emitting element in the organic light-emitting device is a top-emission element which emits the light emitted from a light-emitting layer in a direction opposite to the substrate.

An organic light-emitting device according to a first embodiment of the present invention can be produced in a production process shown in FIG. 1 to FIG. 9. Next, the process of producing the organic light-emitting device according to the first embodiment of the present invention will be sequentially described.

Figure 1:
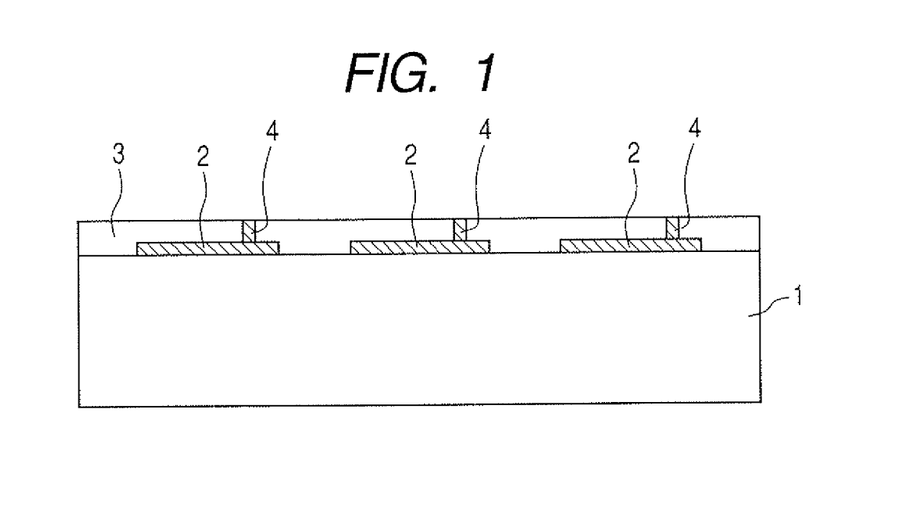
FIG. 1 is a schematically sectional view showing one step of a process of sequentially producing an organic light-emitting device according to a first embodiment of the present invention.

At first, as shown in FIG. 1, a TFT 2 for driving a plurality of organic light-emitting elements is formed on a substrate 1 made of glass or the like. Furthermore, a planerization layer 3 for flattening the unevenness caused by the TFT 2 is further formed on the substrate 1. The planerization layer 3 is formed of an organic material such as an acrylic resin or a polyimide resin. Many contact holes 4 are formed in the planerization layer 3 so as to electrically connect an output terminal of the TFT 2 to the first electrode (lower electrode) of the organic light-emitting element. In the case shown in FIG. 1, the contact holes 4 are in the state of being filled with an electroconductive material.

Figure 2:
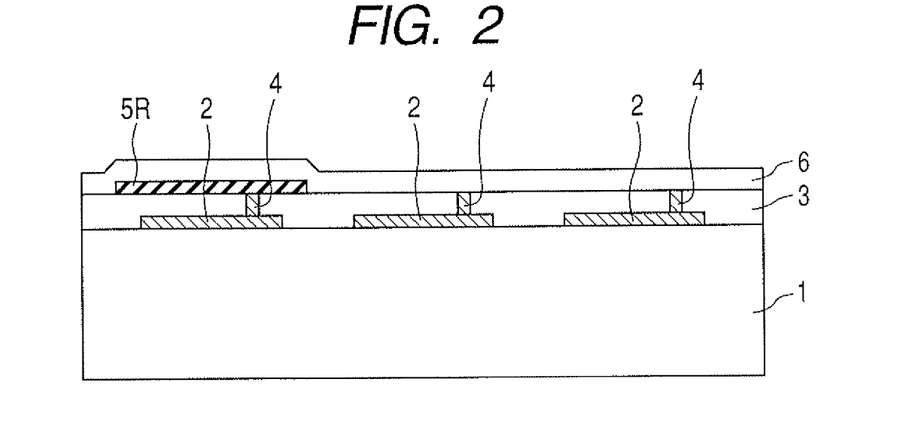
FIG. 2 is a schematically sectional view showing one step of a process of sequentially producing an organic light-emitting device according to a first embodiment of the present invention.

Subsequently, as shown in FIG. 2, a reflection layer 5R for use in a red-light-emitting element was formed at a position where the red-light-emitting element is to be formed (region of red-light-emitting element) by using a mask vapor-deposition technique. Specifically, Cr was vapor-deposited with a resistance heating method to form the reflection layer 5R with a thickness of 10 nm for use in the red-light-emitting element.

Subsequently, the first transparent conductive layer 6 made of ITO is formed in a thickness of 15 nm by a sputtering method. The first transparent conductive layer 6 has only to be commonly formed on and between a plurality of elements which are to be formed on a substrate 1, and does not need to be patterned.

Figure 3:
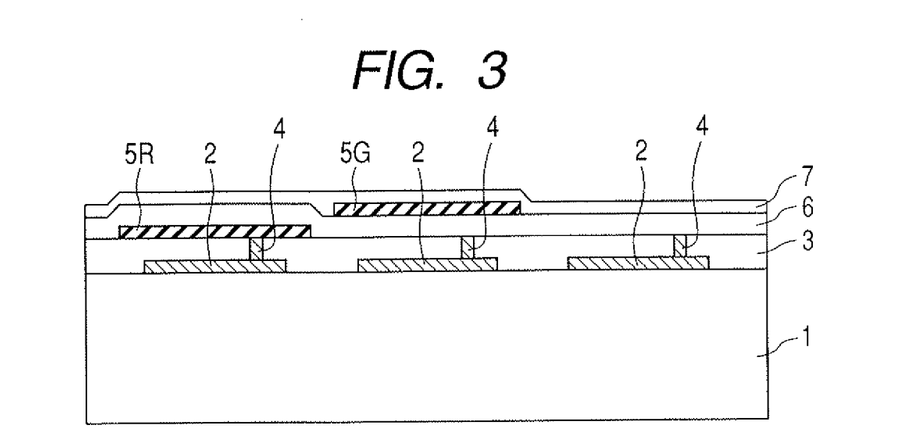
FIG. 3 is a schematically sectional view showing one step of a process of sequentially producing an organic light-emitting device according to a first embodiment of the present invention.

Subsequently, as shown in FIG. 3, a pattern of a reflection layer 5G for use in a green-light-emitting element is formed at a position where the green-light-emitting element is to be formed (region of green-light-emitting element), by vapor-depositing Cr on the first transparent conductive layer 6 in a thickness of 10 nm by a mask vacuum-deposition method.

Subsequently, the second transparent conductive layer 7 made of ITO is formed in the thickness of 10 nm by a sputtering method. The second transparent conductive layer 7 also has only to be commonly formed on and between a plurality of elements which are to be formed on a substrate 1, and does not need to be patterned.

Figure 4:
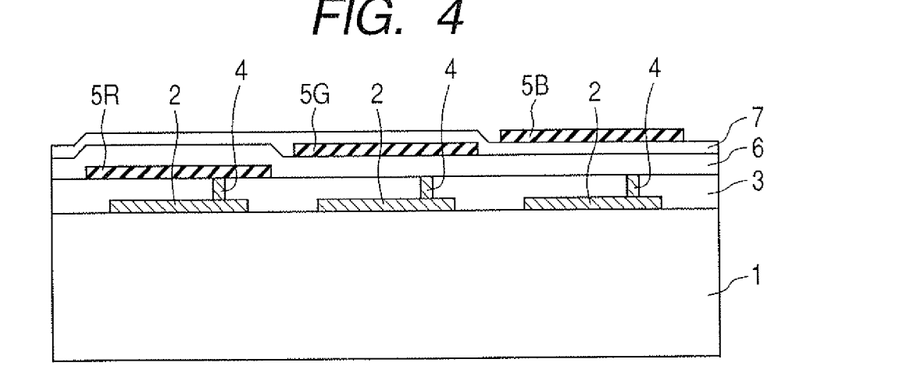
FIG. 4 is a schematically sectional view showing one step of a process of sequentially producing an organic light-emitting device according to a first embodiment of the present invention.

Subsequently, as shown in FIG. 4, a pattern of a reflection layer 5B for use in a blue-light-emitting element is formed at a position where the blue-light-emitting element is to be formed (region of blue-light-emitting element), by vapor-depositing Cr on the second transparent conductive layer 7 in the thickness of 10 nm by a mask vacuum-deposition method.

Figure 5:
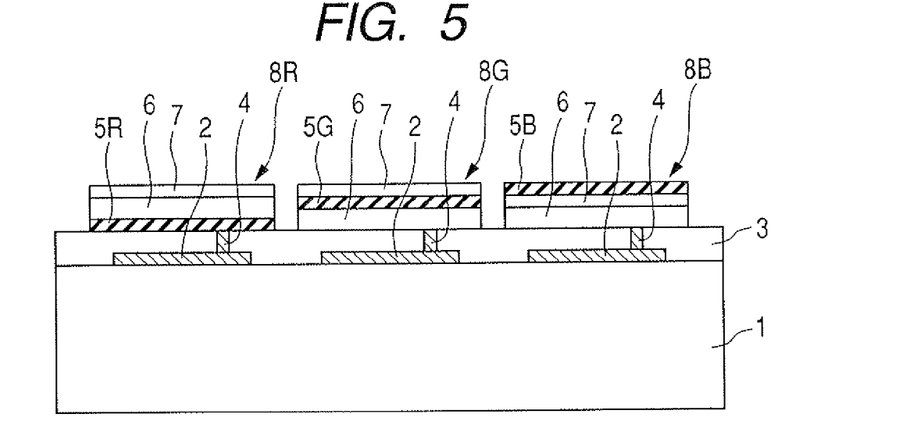
FIG. 5 is a schematically sectional view showing one step of a process of sequentially producing an organic light-emitting device according to a first embodiment of the present invention.

Subsequently, as shown in FIG. 5, a resist is formed on each portion (the first electrode in case of the present embodiment) where each organic light-emitting element of emitting the light of each emission color was to be formed, and then undesired portions which are ITO films and Cr films formed between the elements are removed by using an etching technique. However, the ITO films are etched in the present step, not for adjusting the thickness of themselves but for removing the undesired parts of themselves. In other words, the ITO films can be easily etched in the present step, because the etching operation needs not to be stopped at a predetermined thickness ITO, in contrast to the etching operation which is carried out for adjusting an optical length and is required to be accurate.

In a first embodiment, transparent conductive layers, which are made of Cr, have a thickness of 10 nm, and are stacked in a light-extracting side when viewed from reflection layers 5R, 5G and 5B, function as a layer for adjusting an optical path length of an emitted light of each emission color (length-adjusting layer).

Specifically, a thickness of a length-adjusting layer corresponding to the reflection layer 5R for use in a red-light-emitting element is 25 nm, and is equal to the sum of the thicknesses of the first transparent conductive layer 6 and the second transparent conductive layer 7.

The thickness of the length-adjusting layer corresponding to the reflection layer 5G for use in a green-light-emitting element is 10 nm, and is equal to the thickness of the second transparent conductive layer 7.

The thickness of the length-adjusting layer corresponding to the blue-light reflection layer 5B is 0 nm.

In the present embodiment, the first electrode 8R corresponding to a red color is formed of a reflection layer 5R which is made of Cr and has the thickness of 10 nm, and a transparent conductive layer which is stacked thereon and has the thickness of 25 nm (the sum of transparent conductive layer 6 and second transparent conductive layer 7); and consequently has the total thickness of 35 nm.

The first electrode 8G corresponding to a green color is formed of a transparent conductive layer 6 having the thickness of 15 nm, a reflection layer 5G which is stacked thereon, is made of Cr and has the thickness of 10 nm, and further the second transparent conductive layer 7 which is stacked thereon and has the thickness of 10 nm; and consequently has the total thickness of 35 nm.

The first electrode 8B corresponding to a blue color is formed of a transparent conductive layer 6 having the thickness of 15 nm, the transparent conductive layer 7 which is stacked thereon and has the thickness of 10 nm, and a reflection layer 5G which is further stacked thereon, is made of Cr and has the thickness of 10 nm; and consequently has the total thickness of 35 nm.

A transparent conductive layer 6 and the second transparent conductive layer 7 both in the first electrode can be made of an inorganic material. For instance, an electroconductive material of an inorganic oxide can be used.

The first electrodes of organic light-emitting elements corresponding to respective colors are formed by the above described steps. As described above, the thicknesses of the first electrodes can be equal in a plurality of the organic light-emitting elements of emitting lights of the different colors.

Each thickness of the first electrodes 8R, 8G and 8B for respective colors is 35 nm, so that the heights of the lower electrodes from a substrate 1 become are equal except error.

First electrodes 8R, 8G and 8B are electrically connected to respectively corresponding output terminals of a TFT 2 through contact holes 4.

The organic light-emitting device in the present embodiment is driven in a state of having set the first electrode (lower electrode) of the organic light-emitting element as a positive electrode and the second electrode (upper electrode) as a negative electrode. On account of this, even when the organic light-emitting device employs a plurality of TFTs 2 for driving one organic light-emitting element, the TFT 2 which is a final output terminal becomes a P-channel type.

Figure 6:
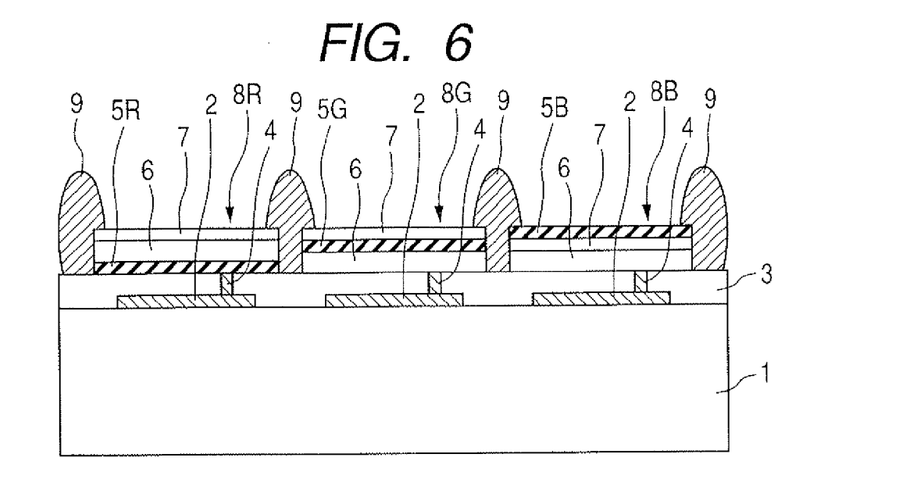
FIG. 6 is a schematically sectional view showing one step of a process of sequentially producing an organic light-emitting device according to a first embodiment of the present invention.

Subsequently, as shown in FIG. 6, an element isolation layer 9 made of polyimide is formed on the first electrodes 8R, 8G and 8B. The element isolation layer 9 was patterned so as to have openings on sides of the first electrodes 8R, 8G and 8B and to have the thickness of 220 nm.

Figure 9:
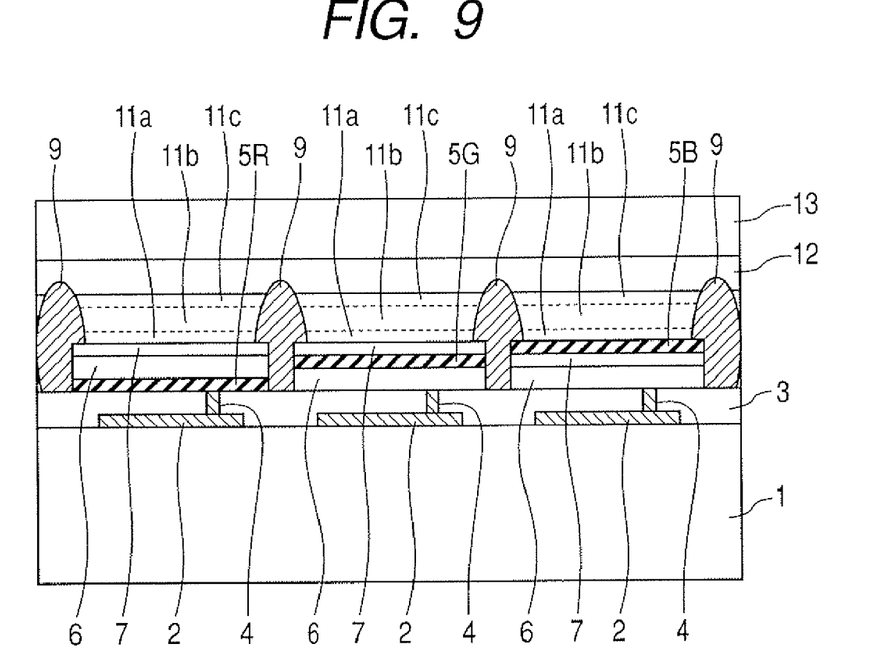
FIG. 9 is a schematically sectional view showing one step of a process of sequentially producing an organic light-emitting device according to a first embodiment of the present invention.

The element isolation layer 9 prevents color mixture from occurring due to the mixture of light-emitting layers having different colors in the separation parts of the respective colors, and works for reducing a short circuit or a leakage occurring between first electrodes 8R, 8G and 8B and an upper electrode 12, in the separation parts of the respective colors (see FIG. 9).

Figure 7:
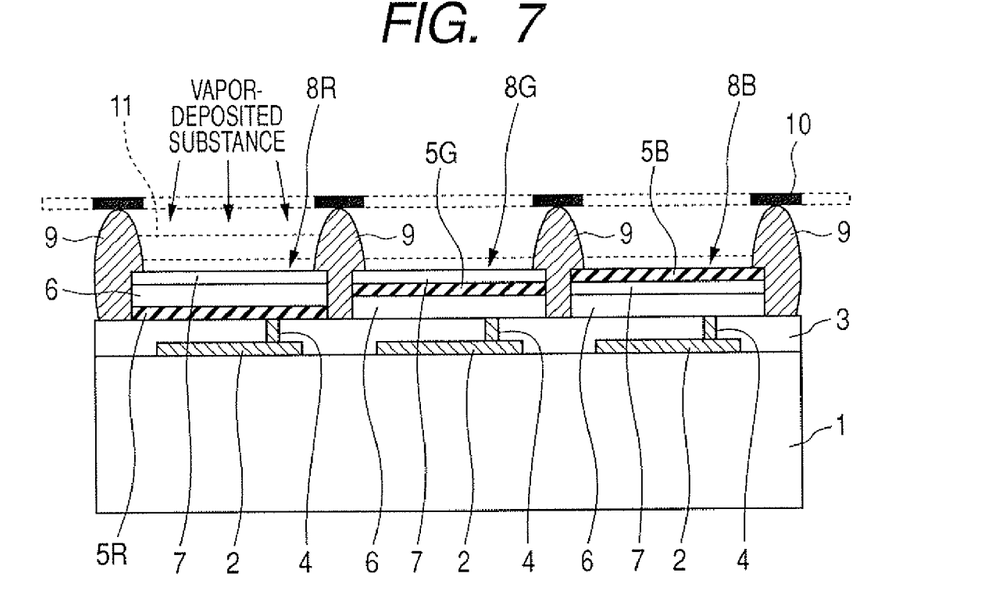
FIG. 7 is a schematically sectional view showing one step of a process of sequentially producing an organic light-emitting device according to a first embodiment of the present invention.

The element isolation layer 9 further prevents a mask 10 from damaging an already vapor-deposited film on the first electrodes 8R, 8G and 8B, by making a non-opening part of the mask 10 placed on the element isolation layer 9 when organic compound layers are formed on the first electrodes 8R, 8G and 8B with a mask vapor-deposition method (see FIG. 7). The organic light-emitting device in a first embodiment makes heights of upper surfaces of organic compound layers for respective colors from a substrate 1 (each total thickness of the first electrode and the organic compound layer for respective colors) approximately equal as described later, and accordingly can make the element isolation layer 9 thinner than ever; can make the element isolation layer 9 sufficiently develop the function, though having made the element isolation layer 9 thinner than ever; and can make the step between planes including the element isolation layer 9 after an organic layer has been formed to be smaller than ever.

Subsequently, as shown in FIG. 7, an organic compound layer 11 is formed on a part at which a light-emitting layer of an organic light-emitting element for each color is to be formed by the steps of mounting a mask 10 having openings on an element isolation layer 9 and vapor-depositing a deposition material.

Incidentally, although FIG. 7 shows the mask 10 having openings formed at all positions corresponding to R, G and B in order to schematically shows the process for forming the light-emitting layers for respective colors, needless to say, an actually used mask has an opening formed at a position corresponding to any one of R, G and B.

The organic compound layer 11 has an organic functional layer for controlling the injection and transportation of an electric charge. The organic functional layer can be formed commonly on a plurality of organic light-emitting elements for different emission colors. Specifically, the organic compound layer 11 includes light-emitting layers for emitting lights of respective colors of at least red, green and blue; and additionally includes a layer for injecting and transporting the electric charge of a hole and an electron, as needed, such as a hole injection layer, a hole transport layer, an electron transport layer and an electron injection layer. Among these layers, at least the light-emitting layers for emitting the red light, the green light and the blue light need to be separately formed. However, the charge (hole and electron) injection layer or the charge transport layer needs not to be separately formed according to each color, as long as the material can be used commonly for each color, but may be commonly formed on a plurality of the elements of emitting lights of different colors. When the light-emitting layers for the respective colors are formed with a mask vapor-deposition method, the organic light-emitting elements for the respective colors are usually formed into the same size and at the same pitch. Accordingly, the organic light-emitting elements for the respective colors may be produced by repeatedly vapor-depositing a deposition material while moving one mask by the space of one opening and aligning the mask to the position. Alternatively, the organic light-emitting elements for the respective colors may be produced in a vapor-deposition process, while aligning the masks having the openings respectively corresponding to positions at which the organic light-emitting elements for the red color, the green color and the blue color will be formed, to the positions of the colors respectively, instead of moving one mask.

Figure 8:
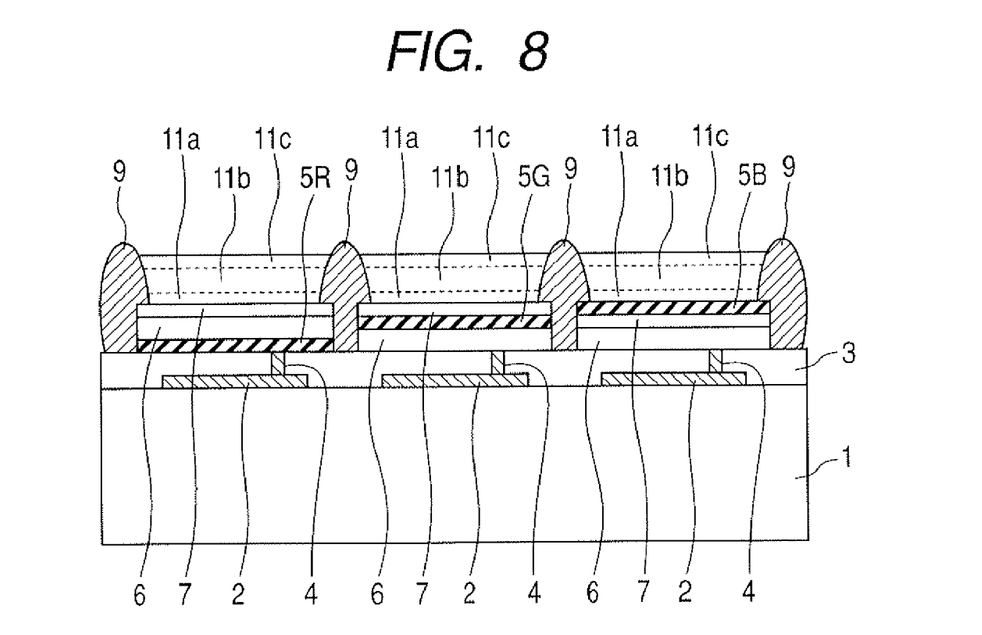
FIG. 8 is a schematically sectional view showing one step of a process of sequentially producing an organic light-emitting device according to a first embodiment of the present invention.

By the above described steps, an organic light-emitting element having an organic compound layer formed thereon is produced. Specifically, the organic light-emitting element in a first embodiment has a hole transport layer 11a, a light-emitting layer 11b and an electron transport layer 11c formed thereon as organic compound layers, as is shown in FIG. 8. In the next place, materials used for forming the organic compound layers will be described.

TPD was used as a material of the hole transport layer 11a, and Alq was used as a material of the electron transport layer.

Alq was also used as a material of a green-light-emitting layer 11b. As a material of a red-light-emitting layer 11b, Alq doped with 0.8% DCM by a volume ratio was used (where DCM is 4-(dicyanomethylene)-2-methyl-6-(p-dimethylaminostyryl)-4H-pyran). As a material of a blue-light-emitting layer 11b, PC-7bis (2-methyl-8-quinolinolate) (para-phenylphenolate) aluminum (III) was used.

A hole transport layer 11a and an electron transport layer 11c were commonly formed on elements for respective colors. The hole transport layer 11a was formed in the thickness of 95 nm, light-emitting layers 11b were formed in the thickness of 50 nm commonly on the elements for the respective colors, and the electron transport layer 11c was formed in the thickness of 20 nm. The materials for the hole transport layer 11a, the light-emitting layers 11b and the electron transport layer 11c are not limited to the above described materials, but other materials known as materials for forming respective organic compound layers may be used.

Reflection layers in first electrodes 8R, 8G and 8B can be formed so that when $\lambda$ is defined as a central wavelength of an emitted light of each color, an optical path length (L) between a light-emitting position (light-emitting interface) of a light-emitting layer and a reflective surface of the reflection layer can satisfy the expression of:

$$L=\lambda/4((2m-1)-\Phi/2\pi) \quad (A)$$

(m represents an integer and $\Phi$ represents a phase shift (radian) on the reflection layer).

As was described above, an optical path length of an organic compound layer part is the product of a thickness of a hole transport layer 11a multiplied by a refractive index of the hole transport layer 11a, when a light-emitting position of a light-emitting layer is assumed to approximately correspond to an interface between the light-emitting layer and the hole transport layer 11a. The optical path length between a light-emitting interface and the reflective surface of an organic light-emitting element for each color is the sum of the optical path length in the hole transport layer 11a and the optical path length corresponding to the thickness of a transparent layer (ITO) between the hole transport layer 11a and the reflective surface.

When supposing that a refractive index of an organic compound layer is about 1.8 and a refractive index of ITO is about 2.0, each optical path length between a light-emitting plane and a reflective surface of organic light-emitting elements for emitting lights of a red color (R), a green color (G) and a blue color (B) are described in the following expressions (in which (m) is supposed to be 1).

$$R: (95 \times 1.8)+(25 \times 2.0)=220 \text{ nm} \quad (1)$$

$$G; (95\times1.8)+(10\times2.0)=190 \text{ nm} \qquad (2)$$

$$B; (95\times1.8)+(0\times2.0)=170 \text{ nm} \qquad (3)$$

The above described values (1) to (3) are values corresponding to L=nd in an expression (A). Accordingly, when the value is a value obtained by multiplying ¼ peak wavelength λ of each color by 2m−1−Φ/2π (wherein Φ represents a phase shift (radian) on a reflective surface), each color is amplified on a reflection side by an interference effect. As a result, light extraction efficiency can be improved.

The peak wavelength λ of an emitted light of each color is about 620 nm for a red color, is about 530 nm for a green color, and is about 480 nm for a blue color. A phase shift occurring when light is reflected on a Cr surface was −2.6 radian. Accordingly, the value (L) determined from the expression (A)

is about 220 nm for the red color,
is about 187 nm for the green color and
is about 170 nm for the blue color, when assuming m=1

(lightest condition), which values are approximately equal to the above described values (1) to (3). By thus composing the first electrode as described in a first embodiment, an optical path length between a light-emitting position and a reflective surface can be approximately optimized.

Subsequently to the production steps described with reference to FIG. 8, an ITO film is formed into the thickness of 60 nm on an upper surface of an organic compound layer 11 with a sputtering method, as the second electrode 12 which functions as a light extraction electrode, as is shown in FIG. 9. The second electrode 12 was commonly formed on organic light-emitting elements for the respective colors. The second electrode 12 is also a cathode, because of being an electrode in an electron injection side. In addition, an electron injection property may be improved by providing an electron injection layer (not shown) in an interface between the organic compound layer (electron transport layer 11c) and the second electrode 12 made of ITO.

Subsequently, a sealing film 13 made of SiN$_4$ is stacked in the thickness of 1 μm on the second electrode 12 in order to shield an organic light-emitting element from outer air to complete an organic light-emitting device having three organic light-emitting elements of emitting the lights of three different colors. Furthermore, a display apparatus according to the present invention can be produced by combining a plurality of the organic light-emitting devices. The display apparatus can be suitably used in a TV receiver, a monitor for a computer, a display screen of a mobile telephone, a display screen of a personal digital assistant (PDA), a display screen of a mobile music player, a display screen of an imaging device and the like. An airtight vessel may be formed on the display apparatus by adhesively bonding a glass plate onto the display apparatus so as to further improve the barrier properties against outside air. Furthermore, when the display apparatus has a structure provided with such an airtight vessel, the vessel may have a getter for absorbing water and oxygen arranged therein.

A light-emitting layer is controlled to have a thickness generally between about 10 nm and about 100 nm. When the light-emitting layer is thick, driving voltage increases, and when being thin, the layer degrades its film properties and lowers its light-emitting efficiency. Accordingly, the light-emitting layer in each color of a red, a green and a blue can have a thickness approximately between 30 nm and 70 nm.

In an organic light-emitting device according to a first embodiment, light-emitting layers for emitting lights of a red color, a green color and a blue color are separately coated with a mask vapor-deposition method as was described above, and accordingly provide no particular merit in being formed into the same thickness. However, there is no necessity of changing the thicknesses of the light-emitting layers even in consideration of the electric characteristics. Accordingly, in the first embodiment, the light-emitting layers were formed in the thickness of 50 nm commonly for the red color, the green color and the blue color, as was described above. Thus, the first electrodes 8 of the respective organic light-emitting elements for the red color, the green color and the blue color have the common thickness, so that the heights from a substrate 1 to the upper surfaces of organic compound layers (electron transport layers 11c) before the second electrodes 12 are formed are about 200 nm, which are approximately common for the respective colors. Accordingly, steps in the plane of forming the second electrode 12 can be made smaller than ever, even when an element isolation layer 9 with a thickness of 220 nm is included. For this reason, the organic light-emitting device can show the high quality of causing no electroconduction failure particularly due to discontinuities at the step, even though having an ITO film of 60 nm which is thinner than ever.

Second Embodiment

Figure 10:
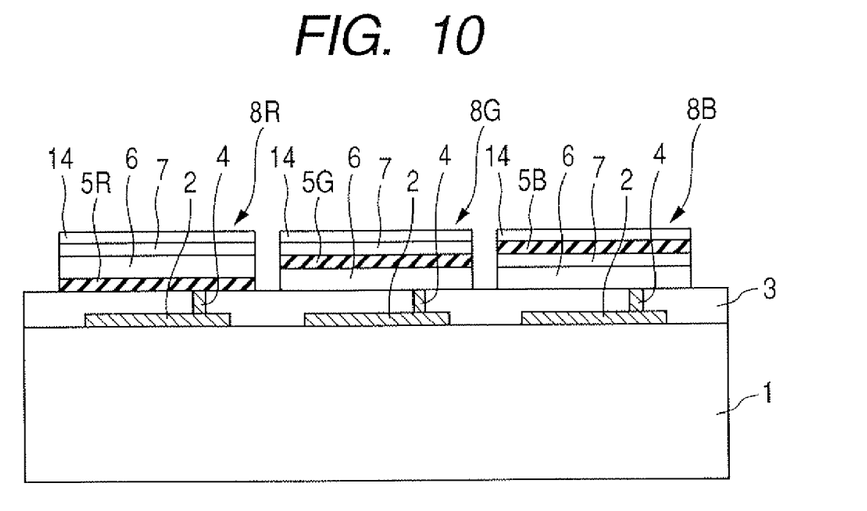
FIG. 10 is a schematically sectional view showing a diagrammatic structure on the way of a process of producing an organic light-emitting device according to a second embodiment of the present invention.

FIG. 10 is a schematic view showing a diagrammatic structure on the way of a process of producing an organic light-emitting device according to a second embodiment of the present invention. In addition, FIG. 10 relating to the second embodiment corresponds to FIG. 5 relating to a first embodiment.

As is shown in FIG. 10, the organic light-emitting device according to the second embodiment has an ITO film (third transparent conductive layer 14) stacked on the outermost surfaces (light-extracting side) of the first electrodes 8R, 8G and 8B of organic light-emitting elements for respective colors, which is a different point from the organic light-emitting device according to the first embodiment (see FIG. 5).

That is, on the reflection layer 5B for a blue light-emitting element in the first embodiment, further a third transparent conductive layer 14 made of vapor-deposited ITO having a thickness of 10 nm is formed to become the first electrode 8B for blue in the present embodiment. In addition, the third transparent conductive layer 14 is formed common to the light-emitting elements for three colors. Therefore, in the red light-emitting element and the green light-emitting element, on the upper surface of the second transparent conductive layer in the first embodiment, further third transparent conductive layers 14 having a thickness of 10 nm are formed to become the first electrode 8R for red and the first electrode 8G for green in the present embodiment, respectively.

In the present embodiment, aluminum (Al) was vapor-deposited in a thickness of 10 nm to form reflection layers 5R, 5G and 5B of each color.

Except the above points, the organic light-emitting device according to a second embodiment has approximately similar structure to that of an organic light-emitting device according to a first embodiment.

Thus, an organic light-emitting device according to a second embodiment has an ITO film with the thickness of 10 nm stacked between a reflection layer and a light-emitting interface both of each color. Accordingly, the organic light-emitting device according to the second embodiment shall have an optical path length (nd) increased by 2.0×10=20 nm, in comparison with that in a first embodiment; then, sets the thickness of a hole transport layer 11a at 85 nm commonly on the elements for each color by reducing 10 nm; consequently controls the optical path length in organic light-emitting elements for each color approximately equal to that in the first embodiment; and thereby can improve the light extraction efficiency by an interference effect.

In the second embodiment, a transport layer (hole transport layer 11a) of the organic light-emitting element for each color contacts the ITO film. ITO has a large work function, so that positive holes are efficiently injected into the hole transport layer. Accordingly, the organic light-emitting device in the second embodiment could employ a metal which has high reflectivity but does not efficiently inject the positive holes into the hole transport layer, such as Al and Ag, for a material of the reflection layer.

Third Embodiment

Figure 11:
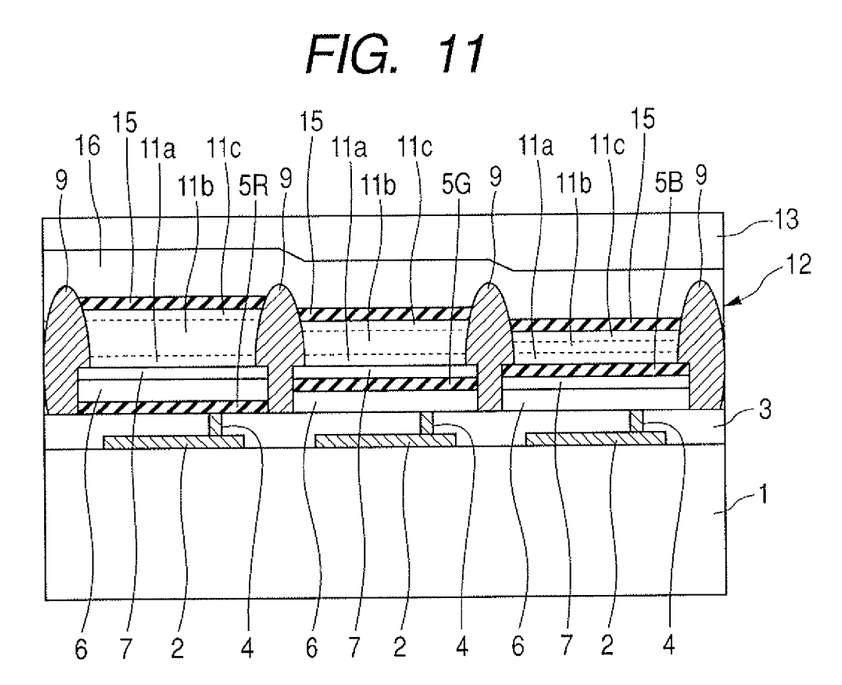
FIG. 11 is a schematically sectional view showing a diagrammatic structure of an organic light-emitting device according to a third embodiment of the present invention.

FIG. 11 is a schematic view showing a diagrammatic structure of an organic light-emitting device according to a third embodiment of the present invention. In addition, FIG. 11 relating to the third embodiment corresponds to FIG. 9 relating to a first embodiment.

As is shown in FIG. 11, the organic light-emitting device according to the third embodiment has a semi-transparent reflection layer 15 provided the lowest surface (opposite side of a light-extracting side) of a second electrode 12 of an organic light-emitting element for each color, which is a different point from an organic light-emitting device according to the first embodiment (see FIG. 9). The semi-transparent reflection layer 15 is made of a conductive material and constitutes the second electrode in the present embodiment. Except the above point, the organic light-emitting device according to the third embodiment has an approximately similar structure to that of the organic light-emitting device according to the first embodiment.

In order to improve light extraction efficiency, in the present embodiment, the second electrode 12 which functions as a light extraction electrode has a semi-transparent reflection layer 15 that reflects one part of an emitted light and transmits the other part of the emitted light, and forms a resonator structure between a reflective surface (an interface on an organic compound layer side) of the semi-transparent reflection layer and a reflective surface of a reflection layer in the first electrode.

Specifically, as shown in FIG. 11, an organic light-emitting device according to the third embodiment had an Ag film with the thickness of 10 nm vapor-deposited on the organic compound layer, which is the semi-transparent reflection layer 15 that transmits one part of the emitted light and reflects the other part.

Subsequently, an upper transparent conductive layer 16 was formed on the semi-transparent reflection layer 15, in order to reduce the electric resistance. The upper transparent conductive layer 16 is made of an ITO film with the thickness of 50 nm formed with a sputtering method. In the third embodiment, the second electrode 12 is constituted by the semi-transparent reflection layer 15 and the upper transparent conductive layer 16.

Semi-transparent reflection layers 15 form micro-resonators between reflection layers 5R, 5G and 5B of the first electrode and the semi-transparent reflection layers 15. As is well known, a function of the micro-resonator is to improve light extraction efficiency in a desired wavelength due to an interference effect. In order to make the micro-resonator function, when λ is defined as a peak wavelength of an emitted light, an optical path length (L2) between resonance mirrors (reflection layers 5R, 5G and 5B of the first electrode and the semi-transparent reflection layers 15) needs to be set so as to satisfy the expression (B):

$$L2 = \lambda/2(m - \Phi a/2\pi - \Phi b/2\pi) \quad (B)$$

wherein (m) represents an integer; Φa represents a phase shift (radian) when an emitted light is reflected on the first electrode reflection layer; and Φb represents a phase shift (radian) when the emitted light is reflected on the second electrode semi-transparent reflection layer.

In a third embodiment, the first electrode is produced on the same condition as in a first embodiment. Accordingly, when λ is defined as a peak wavelength of an emitted light of each color, an optical length (La) between each light-emitting plane of a red color, a green color and a blue color and a reflective surface of the first electrode is set so as to satisfy a relationship of La=λ/4((2m−1)−Φa/2π), (wherein m=1), which is the previously described expression (A).

Here, the following is considered about an optical path length between a light-emitting plane of a light-emitting layer 11b and a semi-transparent reflection layer 15 composing the second electrode 12, In a third embodiment, when λ is defined as a peak wavelength of each color, the thickness of each light-emitting layer 11b for each color was set so that the optical path length (Lb) between the light-emitting plane of the light-emitting layer 11b and a reflective surface (interface on the substrate side of the semi-transparent reflection layer 15) of the semi-transparent reflection layer 15 could satisfy the relationship (C):

$$Lb = \lambda/4((2m-1) - \Phi b/2\pi) \quad (C)$$

wherein m=1. A phase shift at the reflection time in the semi-transparent reflection layer made of Ag was −2.0 radians. Accordingly, the thickness of a red-light-emitting layer 11b was set at 95 nm, the thickness of a green-light-emitting layer 11b was set at 75 nm, and the thickness of a blue-light-emitting layer 1ib was set at 70 nm. In addition, the thickness of an electron transport layer 11c was set at 20 nm commonly for each color.

Supposing that a refractive index of an organic compound layer is about 1.8, optical path lengths between the light-emitting planes and reflective surfaces of the semi-transparent reflection layer 15 in organic light-emitting elements for emitting lights of the red color (R), the green color (G) and the blue color (B) are described below. In the above description, the light-emitting plane is supposed to be an interface between the light-emitting layer 11b and a hole transport layer 11c.

$$R(\text{upper side}); (95+20) \times 1.8 = 207 \text{ nm} \quad (4)$$

$$G(\text{upper side}); (75+20) \times 1.8 = 171 \text{ nm} \quad (5)$$

$$B(\text{upper side}); (70+20) \times 1.8 = 162 \text{ nm} \quad (6)$$

The peak wavelength λ in an emitted light of each color is about 620 nm in the red color, is about 530 nm in the green color and is about 480 nm in the blue color.
Accordingly, the value of Lb in the expression (C)
is about 205 nm in the red color,
is about 175 nm in the green color and
is about 160 nm in the blue color, which are approximately equal to the values of the above described expressions in (4) to (6).

As a result of this, the optical path length between resonance mirrors satisfies the condition of a resonator structure described in the expression (B) for each of the red color, the green color and the blue color, and can improve light extraction efficiency.

Thus, according to a third embodiment, an optical path length can be easily optimized even when a resonator structure is employed. In addition, an organic light-emitting device according to the third embodiment can equalize the thickness of the first electrode for each color while optimizing the optical path length in the first electrode side for each color, and accordingly can make a difference of heights of the upper surface of a semi-transparent reflection layer 15 formed on an organic compound layer smaller than ever. As a result, though the semi-transparent reflection layer 15 has only the thickness of 10 nm, the reflection layer 15 could be uniformly formed while securing a specular surface.

Fourth Embodiment

An organic light-emitting device according to a fourth embodiment of the present invention has an approximately similar diagrammatic structure to that of a sectional schematic view (FIG. 11) showing a third embodiment, but has a hole transport layer 11a formed in the thickness of 40 nm and an electron transport layer 11c formed in the thickness of 15 nm.

Subsequently, in the organic light-emitting device according to the fourth embodiment of the present invention, a red-light-emitting layer, a green-light-emitting layer and a blue-light-emitting layer were sequentially stacked commonly on all the picture elements as a light-emitting layer lib with a vapor-deposition technique.

In the case of the present embodiment, there is no fear that the light-emitting layer of each color extends to an adjacent light-emitting layer and causes a color mixture, so that there is an advantage of needing no mask or only a mask with rough accuracy, when the light-emitting layer is formed with a vapor-deposition technique. A specific material for forming the above described red-light-emitting layer includes, for instance, 4,4'-bis(2,2-diphenylvinyl)biphenyl (DPVBi) blended with about 30 wt. % of 2,6-bis[(4'-methoxydiphenylamino)styryl]-1,5-dicyanonaphthalene (BSN). The red-light-emitting layer was vapor-deposited in the thickness of 10 nm.

A specific material for forming a green-light-emitting layer includes, for instance, DPVBi blended with about 5 wt. % of cumarin 6. The green-light-emitting layer was vapor-deposited in the thickness of 10 nm.

A specific material for forming a blue-light-emitting layer 182 includes, for instance, DPVBi blended with 2.5 wt. % of 4,4'-bis[2,{4-(N,N-diphenylamino)phenyl}vinyl]biphenyl (DPAVBi). The blue-light-emitting layer was vapor-deposited in the thickness of 30 nm. Accordingly, the thickness of the whole light-emitting layer was 50 nm.

When a light-emitting layer is formed into the above described structure, a green-light-emitting layer emits a green light by reconnecting positive holes which were not reconnected in a red-light-emitting layer with electrons. Furthermore, a blue-light-emitting layer emits a blue light by reconnecting the positive holes which were not reconnected in the red-light-emitting layer and the green-light-emitting layer with electrons. As a result of this, the whole light-emitting layer emits a white light of mixed lights of red, green and blue.

An organic light-emitting device according to the present embodiment has a resonator structure formed therein as in the case of a third embodiment. As shown in the third embodiment, when an optical path length L2 between upper and lower electrodes forming the resonator structure satisfies a relationship of $$L2 = \lambda/2(m - \Phi a/2\pi - \Phi b/2\pi)$$ (B)

the wavelength λ is amplified and are taken out from an upper semi-transparent reflection layer (semi-permeable electrode). Here, as for the thickness of an organic compound layer except a light-emitting layer, a hole transport layer 11a has 40 nm, an electron transport layer 11c has 15 nm, and a transparent conductive layer formed between the reflective surface of the first electrode and the light-emitting layer has 25 nm, 10 nm and 0 nm in R, G and B respectively, as was described above.

Accordingly, an optical path length corresponding to each of R, G and B is determined by determining the total thickness of the organic compound layer between the upper and lower reflective surfaces and the transparent conductive layer, and multiplying a refractive index to the total thickness.

$$Lr = 25 \times 2.0 + (40+50+15) \times 1.8 = 239 \text{ (nm)}$$

$$Lg = 15 \times 2.0 + (40+50+15) \times 1.8 = 219 \text{ (nm)}$$

$$Lb = 0 \times 2.0 + (40+50+15) \times 1.8 = 189 \text{ (nm)}$$

Assuming that a central wavelength of each light to be taken out is about 620 nm for the red color, is about 530 nm for the green color and is about 480 nm for the blue color, and supposing that $\Phi a = -2.6$ radian, $\Phi b = -2.0$ radian and $m = 0$, a distance between reflective surfaces necessary for each light to be amplified by resonance is determined by an expression (B) as follows:

$$L2r = 236 \text{ (nm)};$$

$$L2g = 202 \text{ (nm)};$$

and $L2b = 183$ (nm).

The above described Lr, Lg and Lb were approximately equal to the theoretical values, so that a multicolor organic light-emitting device produced in the present embodiment could take out and emit the lights of the colors R, G and B from the resonator structure by forming the light-emitting layers commonly on all picture elements without needing to separately forming each light-emitting layer on the picture element for each color. Thus, when the resonator structure in a fourth embodiment is used, the optical path length can be easily optimized; and a difference of heights of the upper surface of the semi-transparent reflection layer 15 formed on the organic compound layer can be made smaller than ever. As a result, though the semi-transparent reflection layer 15 has only the thickness of 10 nm, the reflection layer 15 could be uniformly formed while securing a specular surface. In addition, in the present embodiment, color filters may be used on the outer surface of an upper semi-reflective electrode for taking out light and at positions corresponding to the picture elements of R, G and B, for the purpose of further enhancing color purity.

In each of the above described embodiments, a so-called active-matrix-type organic light-emitting device was described in which a TFT for driving each organic light-emitting element is formed for each element, but a passive-type device may be used in the present invention, in which an element is formed on an intersection of stripe-shaped electrodes. In addition, a structure shown in each of the above described embodiments used the first electrode as an anode and the second electrode as a cathode, but a structure in the present invention may also use the first electrode as the cathode and the second electrode as the anode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Laid-Open No. 2006-288220, filed Oct. 24, 2006, and No. 2007-253601 filed Sep. 28, 2007, which are hereby incorporated by reference herein in their entirety.

What is claimed is:

1. An organic light-emitting device, comprising:
a substrate; and
a plurality of organic light-emitting elements formed on the substrate,
wherein the plurality of the organic light-emitting elements include a first organic light-emitting element which emits a light of a first emission color, and a second organic light-emitting element which emits a light of a second emission color different from the first emission color,
wherein each of the organic light-emitting elements has a first electrode, an organic compound layer containing a light-emitting layer, and a second electrode in this order on the substrate,
wherein the first electrode of both the first and second organic light-emitting elements has a light reflection layer and a first transparent conductive layer;
wherein the light reflection layer of the first organic light-emitting element is formed between the substrate and the first transparent conductive layer of the first organic light-emitting element,
wherein the light reflection layer of the second organic light-emitting element is formed between the first transparent conductive layer of the second organic light-emitting element and the organic compound layer of the second organic light-emitting element, and
wherein a thickness of the first transparent conductive layer of the first organic light-emitting element is the same as a thickness of the first transparent conductive layer of the second organic light-emitting element.

2. The organic light-emitting device according to claim 1, wherein
the plurality of the organic light-emitting elements further include a third organic light-emitting element which emits a light of a third emission color different from the first emission color and the second emission color,
the first electrode of the third organic light-emitting element has the light reflection layer and the first transparent conductive layer,
the first electrode of the first to third organic light-emitting elements has a second transparent conductive layer on the organic compound layer side of the first transparent conductive layer, and
the reflection layer of the first organic light-emitting element is formed between the substrate and the first transparent conductive layer of the first organic light-emitting element,
the reflection layer of the second organic light-emitting element is formed between the first transparent conductive layer of the second organic light-emitting element and the second transparent conductive layer of the second organic light-emitting element, and
the reflection layer of the third organic light-emitting element is formed between the second transparent conductive layer of the third organic light-emitting element and the organic compound layer of the third organic light-emitting element.

3. The organic light-emitting device according to claim 2, wherein the second transparent conductive layer in the first organic light-emitting element, the second transparent conductive layer in the second organic light-emitting element and the second transparent conductive layer in the third organic light-emitting element have the same thickness.

4. The organic light-emitting device according to claim 1, wherein
the first electrode of the first and second organic light-emitting elements has respectively a third transparent conductive layer on the organic compound layer side of the first transparent conductive layer, and
the reflection layer of the first organic light-emitting element is formed between the substrate and the first transparent conductive layer of the first organic light-emitting element, and
the reflection layer of the second organic light-emitting element is formed between the first transparent conductive layer and the third transparent conductive layer of the second organic light-emitting element.

5. The organic light-emitting device according to claim 4, wherein the third transparent conductive layer in the first organic light-emitting element and the third transparent conductive layer in the second organic light-emitting element have the same thickness.

6. The organic light-emitting device according to claim 1, wherein an optical path length between the light-emitting layer and the reflection layer of each of the organic light-emitting elements is set so as to amplify a central wavelength in an emission spectrum of the light-emitting layer in each of the organic light-emitting elements.

7. The organic light-emitting device according to claim 1, wherein
the organic compound layer has an organic functional layer of injecting and transporting an electric charge, and
the organic functional layer is commonly formed on the first organic light-emitting element and the second organic light-emitting element.

8. The organic light-emitting device according to claim 1, further comprising a sealing layer.

9. A display apparatus having the organic light-emitting device according to claim 1.

10. A method for producing an organic light-emitting device comprising a plurality of organic light-emitting elements including a first organic light-emitting element which emits a light of a first emission color and a second organic light-emitting element which emits a light of a second emission color different from the first emission color, comprising the steps of:
forming a first electrode having a light reflection layer and a first transparent conductive layer on a substrate;
forming an organic compound layer including a light-emitting layer on the first electrode; and
forming a second electrode on the organic compound layer, wherein the step of forming the first electrode comprises, in mentioned order:
a step of forming the light reflection layer on a region of the first organic light-emitting element,
a step of commonly forming the first transparent conductive layer on both regions of the first and second organic light-emitting elements,
a step of forming the light reflection layer on the region of the second organic light-emitting element, and
a step of removing the transparent conductive layer formed between the elements.

11. An organic light-emitting device, comprising:
a substrate; and
a plurality of organic light-emitting elements formed on the substrate,
wherein the plurality of the organic light-emitting elements include a first organic light-emitting element which emits a light of a first emission color, and a second organic light-emitting element which emits a light of a second emission color different from the first emission color, wherein each of the organic light-emitting elements has a first electrode, an organic compound layer containing a light-emitting layer, and a second electrode in this order on the substrate, wherein the first electrode of the first and second organic light-emitting elements has a light reflection layer and a first transparent conductive layer, wherein the light reflection layer of the first organic light-emitting element is formed between the substrate and the first transparent conductive layer of the first organic light-emitting element, and wherein the light reflection layer of the second organic light-emitting element is formed between the first transparent conductive layer of the second organic light-emitting element and the organic compound layer of the second organic light-emitting element.

* * * * *